United States Patent [19]

Bain

[11] 3,997,800
[45] Dec. 14, 1976

[54] FLIP-FLOP CONTROLLED CLOCK GATING SYSTEM

[75] Inventor: Alexander Bain, Edinburgh, Scotland

[73] Assignee: Burroughs Corporation, Detroit, Mich.

[22] Filed: May 15, 1975

[21] Appl. No.: 577,957

[30] Foreign Application Priority Data

Nov. 6, 1974 United Kingdom ............ 48053/74

[52] U.S. Cl. .......................... 307/269; 307/247 R; 328/63; 328/72
[51] Int. Cl.² .................................. H03K 5/13
[58] Field of Search ............. 307/269, 271, 247 R; 328/187, 188, 63, 61, 48, 72

[56] References Cited

UNITED STATES PATENTS 3,594,648  7/1971  Rappaport ........................... 328/48

Primary Examiner—John Zazworsky
Assistant Examiner—Marcus S. Rasco
Attorney, Agent, or Firm—Benjamin J. Barish; Karl Stoess; Kevin R. Peterson

[57] ABSTRACT

A flip-flop controlled clock gating system comprises a single-shot clock circuit including triggerable means effective to allow the passage of only one clock pulse from the clock input terminal to the output terminal; a clock inhibit circuit including a flip-flop network settable in a first condition enabling the passage of clock pulses from the input to the output terminal and STOP actuator means effective to actuate the flip-flop network to a second condition inhibiting the passage of such clock pulses; and a clock enable circuit including RUN actuator means effective when actuated to trigger the single-shot clock circuit to restore the flip-flop network to its first condition enabling the passage of clock pulses from the input terminal to its output terminal.

17 Claims, 6 Drawing Figures

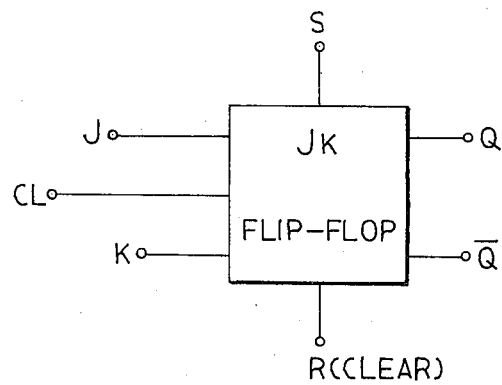
FIG. 2a
| J | K | NEXT CLOCK WILL | Q | $\bar{Q}$ |
|---|---|---|---|---|
| 0 | 0 | NO EFFECT | NO CHANGE | |
| 1 | 0 | SET | 1 | 0 |
| 0 | 1 | CLEAR (RESET) | 0 | 1 |
| 1 | 1 | TOGGLE | INTERCHANGE | |
FIG. 2b
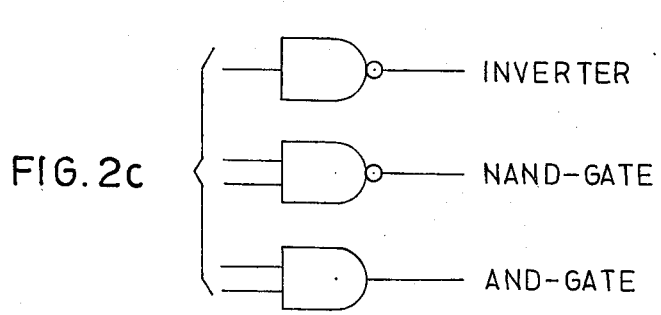
FIG. 2c

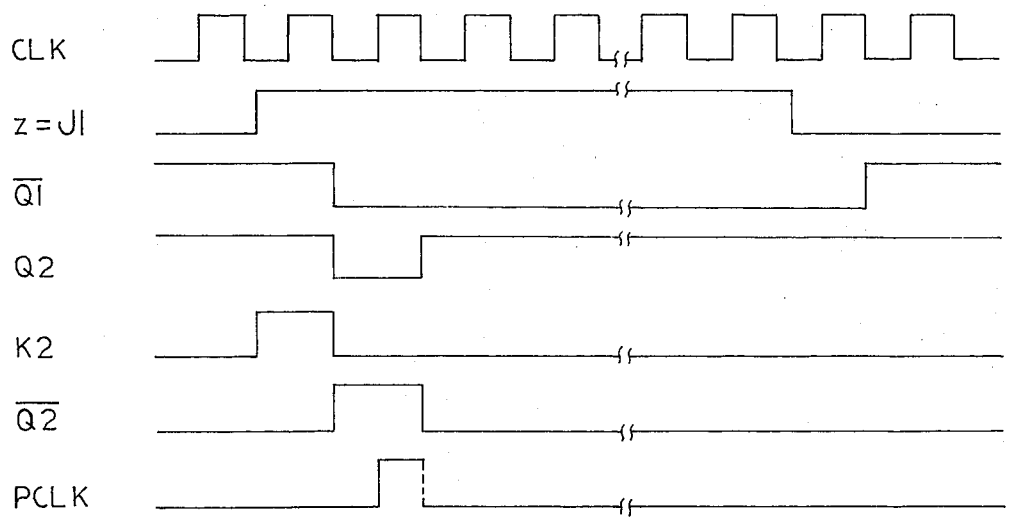
FIG.3 (SINGLE-SHOT CLOCK CIRCUIT)
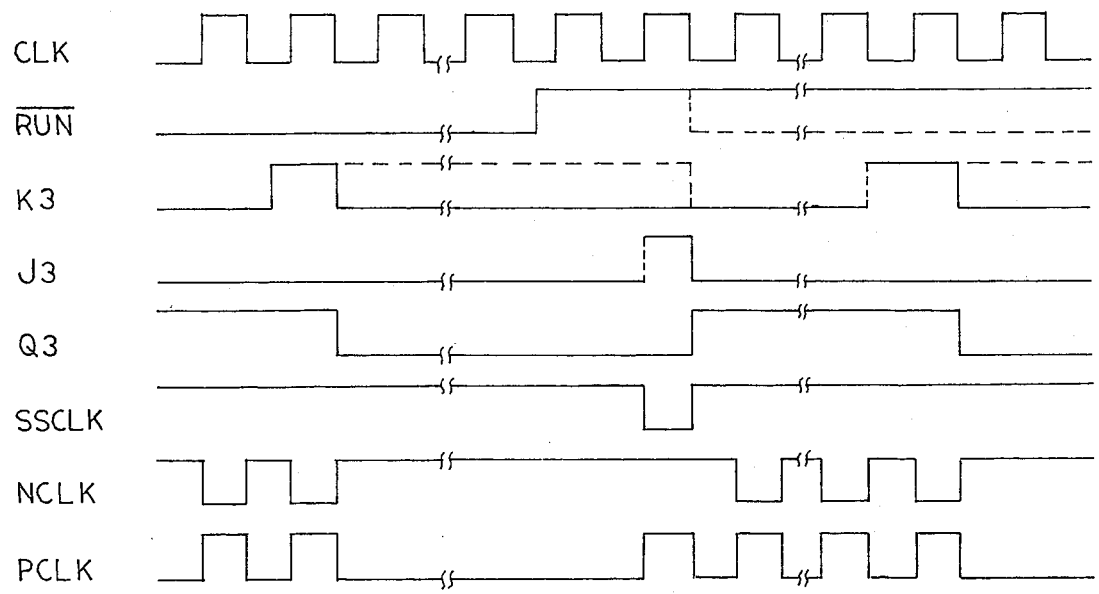
FIG.4 (CLOCK ENABLE/INHIBIT CIRCUIT)

FLIP-FLOP CONTROLLED CLOCK GATING SYSTEM

BACKGROUND OF THE INVENTION

The present invention relates to clock gating systems, such as are used for supplying clock pulses at a controlled rate to a digital data processor, and particularly to clock gating systems controlled by flip-flop networks.

There are many applications in digital data processing systems wherein it is necessary to supply clock pulses at a controlled rate. For example, in testing a data processor, it is frequently necessary to provide a single clock pulse in order to test a specific operation thereof. The single clock pulse is supplied by what is called a single-shot circuit triggered by an actuator, such as a depressible push-button switch, to allow the passage of only one pulse from the normal clock input. Another application, also frequently used in testing data processing systems, requires the provision of a train of clock pulses at the normal clock rate until another actuator is actuated to inhibit the pulses. Such a system usually includes a further actuator which, when actuated, restores the transmission of the clock pulses from the normal clock input.

The control of the clock pulse supply is usually effected by manual means, particularly in manual testing of equipment. The control, however, may also be by automatic means, for example when a testing program specifies supplying a single shot clock to the system being tested, or terminating a train of clocks, when a particular condition is sensed, such as the comparison of two signal levels.

An object of the present invention is to provide a simple and improved clock pulse gating system which is capable of supplying a controlled rate of clock pulses as and when required. Another object is to provide an improved single shot clock circuit, and a further object is to provide an improved clock enable/inhibit circuit.

BRIEF SUMMARY OF THE INVENTION

According to one aspect of the present invention, there is provided a clock pulse gating system, comprising:

A. a clock pulse input terminal for in putting a train of clock pulses;

B. a clock pulse output terminal;

C. a single-shot clock circuit connected between the clock input and output terminals and including triggerable means effective when triggered to allow the passage of only one clock pulse from the clock input terminal to the clock output terminal;

D. a clock inhibit circuit connected between the clock input and output terminals and including:

i. a flip-flop network settable in a first condition enabling the passage of clock pulses from the clock input terminal to the clock output terminal, ii. and STOP actuator means effective when actuated to actuate the flip-flop network to a second condition inhibiting the passage of clock pulses from the clock input terminal to the clock output terminal;

E. and a clock enable circuit connected between said single-shot clock circuit and said clock inhibit circuit and including RUN actuator means effective when actuated to trigger the single-shot clock circuit to restore said flip-flop network to its first condition enabling the passage of clock pulses from the clock input terminal to the clock output terminal.

In the preferred embodiment of the invention described below, the triggerable means of the single-shot clock circuit comprises:

i. a further flip-flop network settable in a first condition inhibiting the passage of clock pulses from the clock input terminal to the clock output terminal, ii. and SINGLE-SHOT actuator means effective when operated to actuate said further flip-flop network to a second condition allowing the passage of only one clock pulse from the clock input terminal to the clock output terminal.

According to another aspect of the invention, there is provided a single-shot clock circuit, particularly useful in the above-described gating system, the single-shot clock circuit comprising:

A. a clock pulse input terminal for inputting a train of clock pulses;

B. a clock pulse output terminal;

C. a flip-flop network settable in a first condition inhibiting the passage of clock pulses from the clock input terminal to the clock output terminal; and D. SINGLE-SHOT actuator means effective when operated to actuate said flip-flop network to a second condition to allow the passage of only one clock pulse from the clock input terminal to the clock output terminal; said flip-flop network of (C) above comprising:

i. a first flip-flop having a first input connected to receive a binary signal from the SINGLE-SHOT actuator means, a second input connected to receive the complement of said binary signal, a first output, and a second output complementary to the first output;

ii. a second flip-flop having a first input connected to the first output of the first flip-flop, a second input connected through a gate to the second output of the first flip-flop, a first output, and a second output complementary to the first output;

iii. said gate having a first input connected to the second output of the first flip-flop, a second input connected to the first output of the second flip-flop, and a third input connected to receive the binary signal from the SINGLE-SHOT actuator means;

iv. and means for applying the clock pulses inputted at the clock input terminal to said first and second flip-flops for clocking same.

According to a further aspect of the invention, there is provided a clock enable/inhibit circuit particularly useful in the above-described clock gating system, the clock enable/inhibit circuit comprising:

A. a clock pulse input terminal for inputting a train of clock pulses;

B. a clock pulse output terminal;

C. a clock inhibit circuit connected between the clock input and output terminals and including:

i. a flip-flop network settable in a first condition enabling the passage of clock pulses from the clock input terminal to the clock output terminal;

ii. and STOP actuator means effective when operated to actuate the flip-flop network to a second condition inhibiting the passage of clock pulses from the clock input terminal to the clock output terminal;

D. and a clock enable circuit including RUN actuator means effective when actuated to restore said flip-flop network to its first condition enabling the passage of clock pulses from the clock input terminal to the clock output terminal; said flip-flop network of (C) (i) above comprising a flip-flop having:

a. a first input connected to said RUN actuator means;

b. a second input connected to said STOP actuator means;

c. a clocking terminal connected to said clock pulse input terminal;

d. and an output connected to said clock pulse output terminal.

Further features and advantages of the invention will be apparent from the description below.

BRIEF DESCRIPTION OF THE DRAWINGS

The invention is herein described, by way of example only, with reference to the accompanying drawings, wherein:

FIG. 2a diagrammatically illustrates in block form a single J-K flip-flop of the type used in the gating system of FIG. 1;

FIG. 2b is a Truth Table of the J-K flip-flop of FIG. 2a;

FIG. 2c diagrammatically illustrates other logic elements used in the gating system of FIG. 1;

FIG. 3 is a timing diagram illustrating the various pulses and signal levels in the single-shot clock circuit portion of the gating system of FIG. 1;

FIG. 4 is a timing diagram illustrating various pulses and signal levels in the clock enable/inhibit circuit portion of the gating system of FIG. 1.

DESCRIPTION OF THE PREFERRED EMBODIMENT

General Arrangement

Figure 1:
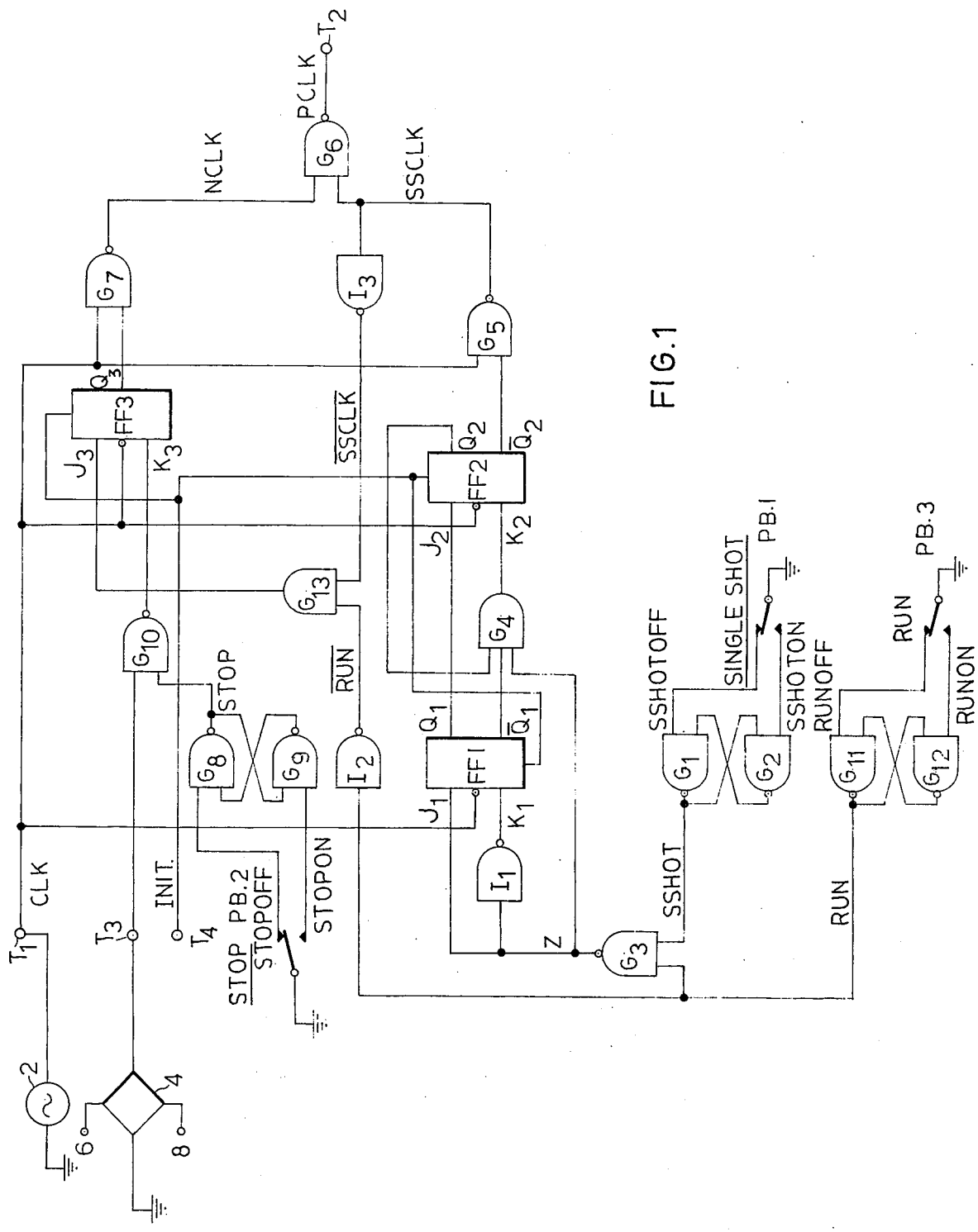
FIG. 1 is a logic diagram illustrating one form of clock pulse gating system constructed in accordance with the invention.

The system illustrated in FIG. 1 includes three J-K flip-flops (FF1, FF2, FF3) controlled by a number of actuators and gates so as to form a single-shot clock circuit supplying single clock pulses as and when demanded, and also a clock enable/inhibit circuit to supply a train of clock pulses as and when demanded.

Briefly, a train of clock pulses is inputted at terminal T1 from a clock pulse generator, shown diagrammatically at 2 in FIG. 1, and the output pulses from the gating system appear on output terminal T2. The single-shot clock circuit of the overall system supplies, at output terminal T2, a single clock pulse from the inputted clock train whenever SINGLE-SHOT push-button PB1 is depressed. The clock enable/inhibit circuit, when enabled, continuously supplies a train of clock pulses at output terminal T2 until a STOP push-button PB2 is depressed, or until a STOP signal is applied via terminal T3 from an external circuit, such as a comparator 4 sensing the signal levels on two lines 6, 8. When the supply of clock pulses is thus inhibited, it will remain inhibited until the system is restored by actuating a RUN push-button PB3.

Both the single-shot and the enable/inhibit circuits use a flip-flop of the J-K type.

J-K flip-flops are well known and are widely used in digital data processing systems since they combine the functions of the "T", "RS" and "RST" flip-flops. FIG. 2a illustrates the various inputs and outputs of the J-K flip-flop, and FIG. 2b illustrates its Truth Table. As shown by the Truth Table, the Q and $\overline{Q}$ outputs of the flip-flop may or may not change state when a clock pulse is applied to the clock (CL) input, depending on the state of the J and K inputs.

The convention is herein adopted, purely for purposes of this description and without any limiting intention, that a "high" signal represents a binary 1 and a "low" signal represents a binary 0; and further, that in the "reset" (clear) condition of the flip-flop its Q output is 0 and its $\overline{Q}$ output is is 1, while in the "set" condition of the flip-flop its Q output is 1 and its $\overline{Q}$ output is 0. The latter is characteristic of DTL logic.

In accordance with the Truth Table of FIG. 2b and the above-defined convention, if both the J and K inputs of the flip-flop are 0, the next clock pulse will produce no change in its Q and $\overline{Q}$ outputs; if its J input is 1 and its K input is 0, the next clock will cause its Q output to go to 1 and its $\overline{Q}$ output to go to 0; if its J input is 0 and its K input is 1, the next clock will cause its Q output to go to 0 and its $\overline{Q}$ output to go to 1; and if both its J and K inputs are 1, the next clock will cause its Q and $\overline{Q}$ outputs to interchange.

FIG. 2c diagrammatically illustrates the other logic elements used in the system of FIG. 1, namely an AND-gate, a NAND-gate, and an inverter.

SINGLE-SHOT CLOCK CIRCUIT

First described is the portion of the system involving mainly the single-shot clock circuit, this circuit being capable of supplying a single clock pulse, whenever commanded.

This circuit includes SINGLE-SHOT push-button PB1 which is connected to a latching network comprising a pair of cross-connected NAND-gates G1 and G2. Normally, push-button PB1 grounds the SSHOTOFF input of the latching circuit, but when the push-button is actuated, it grounds the SSHOTON input of that circuit. Such latching circuits, which are known per se, prevent the possible introduction of spurious electrical signals by contact bounce.

The SSHOT output of the latching circuit of gates G1 and G2 is connected to one input of a NAND-gate G3. A second input of NAND-gate G3 is connected to the switching circuit of RUN push-button PB3, as will be described more fully below.

The output of NAND-gate G3, identified as Z, is fed to the J1 input of flip-flop FF1, the complement of the Z signal being fed via inverter $I_1$ to the K1 input of flip-flop FF1.

The Q1 output of flip-flop FF1 is connected to the J2 input of flip-flop FF2, and the $\overline{Q1}$ output of flip-flop FF1 is connected via AND-gate G4 to the K2 input of flip-flop FF2. AND-gate G4 has two other inputs, one being the Z output from gate G3, and the other being the Q2 output of flip-flop FF2.

The $\overline{Q2}$ output of flip-flop FF2 is used as the "enable" input of NAND-gate G5, the second input of that gate being the train of clock pulses CLK inputted at terminal T1. Thus, whenever $\overline{Q2}$ is high, NAND-gate G5 will pass the train of clock pulses inputted at terminal T1. Each of these pulses in inverted by NAND-gate G5 to form a negative-going pulse SSCLK and is applied to another NAND-gate G6 which gate, when enabled by a high signal NCLK (described below), reinverts the pulse so that it appears at output terminal T2 as a positive-going clock pulse PCLK.

The clock pulses CLK inputted at terminal T1 are also applied to the clock terminals of both flip-flops FF1 and FF2, and clock the flip-flops. The two flip-flops are initialised by an asynchronous INIT. signal inputted at terminal T4.

CLOCK ENABLE/INHIBIT CIRCUIT

The clock enable/inhibit circuit of the gating system illustrated in FIG. 1 includes the third J-K flip-flop FF3. Only its Q3 output is used, and when it is high ("set" condition, see Truth Table, FIG. 2b), it enables NAND-gate G7 to supply the train of clock pulses CLK inputted at terminal T1 to NAND-gate G6 mentioned below. The pulses NCLK exiting from NAND-gate G7 are negative-going and are reinverted by NAND-gate G6 as the positive-going pulses PCLK (assuming the SSCLK output from the single-shot circuit is high) outputted at terminal T2.

The K3 input to flip-flop FF3 is connected to STOP push-button PB2 via a latching network comprising cross-connected NAND-gates G8, G9, and a further NAND-gate G10. The latching network of gates G8, G9 prevents possible spurious signals by contact bounce of push-button switch PB2, as does the latching network of gates G1 and G2.

Normally, STOP push-button PB2 is in the STOP-OFF ("pulse-enable") position illustrated in FIG. 1, wherein it grounds the input line STOPOFF of the latching circuit of gates G8 and G9 so that the STOP output of the latching circuit is high. When push-button PB2 is depressed, it grounds input line STOPON of the latching circuit, whereupon the STOP output of the latching circuit goes low.

The STOP output of the latching circuit of gates G8 and G9 constitutes one input of NAND-gate G10. The second input of that gate is the signal from terminal T3. The latter signal may be supplied, for example, by a condition-sensing device, such as a comparator 4 sensing the signal levels appearing on two lines 6 and 8, respectively.

If STOP push-button PB2 is in its normal (STOP-OFF) position thereby making the STOP output of the latching circuit high, and if the signal inputted at terminal T3 is also high, a low signal will be outputted from NAND-gate G10 to the K3 input terminal of flip-flop FF3. However, if either or both of the above input signals to NAND-gate G10 is low, the output of that gate to the K3 input terminal of flip-flop FF3 will be high.

The J3 input of flip-flop FF3 is connected to RUN push-button PB3 via another latching network (comprising cross-connected NAND-gates G11, G12), an inverter I₂, and an AND-gate G13. Normally, RUN push-button PB3 grounds RUNOFF input of the latching circuit, so that the RUN signal outputted from the latching circuit is high, and the $\overline{\text{RUN}}$ outputted from inverter I₂ is low. AND-gate G13, which receives the latter signal at one of its inputs, also receives a signal from NAND-gate G5 of the single-shot clock circuit, the latter signal (SSCLK) being inverted by an inverter I₃ before being applied, as signal $\overline{\text{SSCLK}}$, to the second input of AND-gate G13.

Thus, the J3 input to flip-flop FF3 will be high only when both the $\overline{\text{RUN}}$ and $\overline{\text{SSCLK}}$ signals are high; if either or both of the above input signals to AND-gate G13 is low, the J3 input to flip-flop FF3 will also be low.

Flip-flop FF3 of the clock enable/inhibit circuit is also clocked by the train of clock pulses CLK inputted at terminal T1, and is initialised to its "set" condition by the asynchronous signal INIT. applied at terminal T4, as the previously described flip-flops FF1 and FF2.

OPERATION OF THE DESCRIBED EMBODIMENT

Single-Shot Clock Circuit Operation

This circuit will normally be used only when the clock enable/inhibit circuit is in the "inhibit" mode, i.e., flip-flop FF3 is in its "reset" condition. When the circuit is used, it generates a single pulse (PCLK) at output terminal T2 whenever the single-shot push-button PB1 is depressed. This is acccomplished in the following manner, reference being made particularly to the timing diagrams of FIG. 3.

As shown in FIG. 3, the train of clock pulses CLK inputted at terminal T1 are positive-going pulses. The single output pulse PCLK generated by the circuit is also positive as shown in FIG. 3.

Initially the condition of SINGLE-SHOT push-button PB1 is as illustrated in FIG. 1, wherein the SSHOTOFF input of the latching circuit of gates G1 and G2 is grounded, so that its output signal SSHOT is high. RUN push-button PB3 is also initially in the position illustrated in FIG. 1 wherein the RUNOFF input to the latching circuit of that push-button is grounded, so that its RUN output is also high. Accordingly, the output Z of NAND-gate G3 will initially be low, as shown in FIG. 3.

The J1 input of flip-flop FF1 will therefore also initially be low, and the K1 input of flip-flop FF1 (by virtue of inverter I₁) will initially be high. The Q1 output of flip-flop FF1 is initially (or will be after the first clock) low, and the $\overline{Q1}$ output is high (FIG. 2b). In addition, since the Z signal is low, AND-gate G4 will keep the K2 input of flip-flop FF2 low. The J2 input of flip-flop FF2 is also low by virture of its direct connection to the Q1 output of flip-flop FF1.

Accordingly, since the J2 and K2 inputs of flip-flop FF2 are both low, the outputs of flip-flop FF2 will not change when it is clocked (Truth Table of FIG. 2b); thus if the $\overline{Q2}$ output is initially low (which is the case), it will remain low. The SSCLK output of NAND-gate G5 will therefore be clamped high, irrespective of the presence of the clock pulses CLK at the second input of NAND-gate G5. The level of NCLK is high during this operation (see below), and therefore the PCLK output of NAND-gate G6 will be low.

Thus initially, when single-shot push-button PB1 is in its raised condition as illustrated in FIG. 1, none of the clock pulses CLK inputted via terminal T1 will appear as output pulses PCLK at output terminal T2.

Now, when SINGLE-SHOT push-button PB1 is depressed, input signal SSHOTON to the latching circuit of gates G1 and G2 is grounded so that the output line SSHOT of the latching circuit goes low. Signal level "Z" outputted from NAND-gate G3 therefore goes high, as will the J1 input of flip-flop FF1, the K1 input of the flip-flop going low by virtue of inverter J1.

Since output $\overline{Q1}$ of flip-flop FF1 was previously high, as was signal Q2 from flip-flop FF2, the fact that signal "Z" now goes high causes gate G4 to produce a high signal on the K2 input to flip-flop FF2. Also, since the J2 input to flip-flop FF2 was low, when flip-flops FF1 and FF2 are clocked, Q1 and J2 both go high, $\overline{Q1}$ and Q2 go low, and $\overline{Q2}$ goes high.

$\overline{Q2}$ going high enables NAND-gate G5, so that the next clock pulse CLK appearing on input terminal T1 and applied to gate G5 will appear as a negative pulse on line SSCLK outputted from NAND-gate G5, and (assuming NCLK is high, which it is as described below) as a positive pulse PCLK outputted from NAND-gate G6. The latter pulse appears at output terminal T2.

The CLK pulse appearing on output terminal T2 as pulse PCLK also clocks the flip-flops FF1 and FF2. Assuming that the time interval between the successive pulses in the train of clock pulses CLK inputted at terminal T1 is much less than the time in which the SINGLE-SHOT push-button PB1 is depressed, signal level Z outputted from NAND-gate G3 will remain high, but a signal level $\overline{Q1}$ from flip-flop FF1 will have gone low, thereby causing input terminal K2 of flip-flop FF2 to go low. Thus, when flip-flops are clocked again, the $\overline{Q2}$ output of flip-flop FF2 will go low, at which condition it remains, thus clamping output line PCLK low. Accordingly, no further pulses will appear on output terminal T2.

Clocking the flip-flops will have no further effect on the output appearing at terminal T2 until SINGLE-SHOT push-button PB1 is released. When this happens, SSHOT goes high, Z goes low, J1 goes low, and K1 goes high; and when the flip-flops are next clocked, Q1 goes low, and $\overline{Q1}$ goes high, thus returning the circuit to its initial condition.

CLOCK ENABLE/INHIBIT CIRCUIT OPERATION

As indicated earlier, the clock enable/inhibit circuit including flip-flop FF3 is used to provide a series of output pulses (PCLK) at output terminal T2 until STOP push-button PB2 is actuated to its STOPON position, or a low signal from circuit 4 is produced at terminal T3, at which time the output pulses PCLK are inhibited; the supply of output pulses is restored by moving RUN push-button PB3 to its RUNON position. The manner in which these functions are performed by the circuit of FIG. 1, will now be described with the help of the timing diagrams of FIG. 4.

This circuit is initialized by the INIT. signal from terminal T4 to set flip-flop FF3 so that its Q3 output is high. Since the STOPOFF input of the latching circuit (gates G8, G9) is grounded by STOP push-button PB2, the STOP output of the latching circuit is high. Also, the signal level on input terminal T3 (from the external condition-sensing device, such as comparator 4) is also high, so that the output of gate G10 is low. Accordingly, the K3 input of flip-flop FF3 is low.

Also initially, since the RUN push-button PB3 grounds the RUNOFF input to the latching circuit (gates G11 and G12) of that push-button, the $\overline{RUN}$ ouput of the latching circuit is high, so that the $\overline{RUN}$ output of inverter I$_2$ is low. Further, as described above signal SSCLK of the single-shot clock circuit is initially high, so that the output signal $\overline{SFFCLK}$ of inverter I$_3$ is low. Accordingly, the output of AND-gate G13 is low. Therefore, the J3 input of flip-flop FF3 is low.

The foregoing initial conditions are illustrated by the timing diagrams of FIG. 4.

Since the Q3 output of flip-flop FF3 is high as indicated above, NAND-gate G7 is enabled so that each positive clock pulse inputted at terminal T1 appears as a negative pulse at the NCLK output of NAND-gate G7, and (SSCLK being high) as a positive pulse at the PCLK output of NAND-gate G6. As the J3 and K3 inputs of flip-flop FF3 are both low, clocking flip-flop FF3 by the clock pulses CLK inputted at terminal T1 will not change the condition of the flip-flop (Truth Table, FIG. 2b).

Accordingly, with each positive-going clock pulse CLK inputted at terminal T1, there will be produced a positive-going PCLK clock pulse at output terminal T2.

Now, when STOP push-button PB2 is actuated, this grounds the STOPON input to the latching circuit of gates G8 and G9. The STOP ouput of the latching circuit will therefore go low. This causes the output of NAND-gate G10 and the K3 input terminal of flip-flop FF3 to go high. The J3 input terminal of flip-flop FF3 still remains low, so that the next time the flip-flop is clocked, its Q3 output goes low (Truth Table FIG. 2b). With Q3 low, the output of NAND-gate G7 will be clamped high, irrespective of the clock pulses CLK; and (SSCLK being high) the PCLK output of NAND-gate G6 is clamped low.

Accordingly, the clock pulses CLK inputted at terminal T2 will be inhibited, and no clock pulses PCLK will appear at output terminal T2.

To restore the supply of pulses at output terminal T2, RUN push-button PB3 would be depressed. When this occurs, the RUNON input to its latching circuit (gates G11, G12) is grounded, whereupon the $\overline{RUN}$ output of the latching circuit goes low, and the $\overline{RUN}$ output of inverter I$_2$ goes high.

Depressing RUN push-button PB3 also actuates the single-shot clock circuit of flip-flop FF1 and FF2, in the same manner as described above when SINGLE-SHOT push-button PB1 is depressed since the outputs of the latching circuits of both push-buttons are inputted into NAND-gate G3. Triggering the single-shot clock circuit of flip-flops FF1 and FF2 causes the next clock CLK to produce a single negative-going pulse at the output SSCLK of NAND-gate G5 (as described above), which pulse is inverted by inverter I$_3$, so that a single positive-going pulse appears at $\overline{SSCLK}$.

Now with the two inputs ($\overline{RUN}$, $\overline{SSCLK}$) to AND-gate G13 being high, the J3 input to flip-flop FF3 also goes high for the single-pulse produced by triggering the single-shot clock circuit. As flop-flop FF3 is clocked at the end of that period, its output Q3 goes high, thereby reenabling NAND-gate G7 to pass the next clock pulse CLK inputted at terminal T1. That clock pulse CLK therefore appears as a negative-going pulse on the output line NCLK of NAND-gate G7, and as a positive-going pulse on the output line PCLK of NAND-gate G6.

Upon the termination of the single pulse produced by triggering the single-shot clock circuit, signal level SSCLK goes low, thus restoring the original low level to input terminal J3 of flip-flop FF3. Signal K3 would also be low (see below) so that subsequent clocks to flip-flop FF3 will not change the high level of its Q3 output terminal (Truth Table, FIG. 2b). With Q3 thus clamped high, the subsequent input clock pulses CLK appear as negative-going pulses at NCLK and (SSCLK being high) as positive-going pulses at PCLK.

As indicated above, when the single-shot clock circuit is triggered causing the J3 input of flip-flop FF3 to go high for one pulse period, the K3 input of the flip flop would normally be low (as shown by the full lines K3, FIG. 4). This is because the STOP push-button PB2 would probably have been released, thus restoring its original condition (illustrated in FIG. 1) of grounding the STOPOFF input of the latching circuit (gates G8, G9), causing the STOP output of the latching circuit to go high, and thereby the output of NAND Gate G10 to go low. However, should the STOP push-button PB3 still be depressed when the RUN Push-button PB3 is depressed, the K3 input of flip-flop FF3 will remain high, whereupon the Q3 output of the flip-flop will go high for one pulse period and then will go low again, and only two pulses will be produced at PCLK — a pulse generated from SSCLK, followed by a single pulse generated from NCLK.

The foregoing describes the operation when STOP push-button PB2 is depressed to inhibit the clock pulses, this actuation of the push-button causing the STOP level inputted to NAND-gate G10 to go low. The same operation occurs when the condition-sensitive device (e.g. comparator 4) causes the signal on input terminal T3 to go low, this signal also being inputted into NAND-gate G10. Thus, the circuit illustrated will inhibit the supply of clock pulses to output terminal T2 whenever either the STOP push-button PB2 is depressed (manual operation), or when a predetermined condition is sensed by circuit 4 (automatic operation), the supply of clock pulses being re-enabled under either operation when the RUN push-button PB3 is actuated.

It will be appreciated that when the single-shot clock circuit (flip-flop FF1, FF2) is to be used, STOP push-button PB2 would have previously been activated, so that flip-flop FF3 is cleared, whereby Q3 is low, thereby causing NCLK to be high. Thus, when the single-shot clock circuit is triggered by depressing push-button PB1, the single negative-going pulse SSCLK produced thereby will be outputted by gate G6 as a single positive-going pulse PCLK.

As one example, the above described system may be constructed using DTL logic, which is characteristic of the convention defined above. Such a logic permits the control of a clock pulse train of 1 MHz. It will be appreciated, however, that the system could be used with other clock frequencies. The lower limit is set by the criterion that the pulse cycle time must be less than the minimum time for which the push-button would be held down, while the upper limit is determined by logic delays. The longest logic path between synchronous elements in the system is three gate delays; this gives an upper frequency limit of about 3.5 MHz using DTL circuit elements. The upper frequency limit could be extended further by using TTL logic.

Further, in the example described, the SINGLE-SHOT, STOP, and RUN actuators are all illustrated as manually-operated push-buttons, PB1, PB2, and PB3, respectively. Such an arrangement is particularly useful for testing digital processing systems, to provide manually-controlled single pulses or trains of pulses as and when required during the testing procedure. In the described example, an automatic actuator for the clock inhibit circuit is used, this being comparator 4 which senses a given condition (e.g. the relative signal levels of inputs 6, 8) so as to inhibit the supply of clock pulses to the data processing system whenever this condition is sensed, for example to permit an examination, at that time, of the state of the data processor being tested. It will be appreciated, however, that the other actuators could also be automatic, for example by programming a single-shot, inhibit, or enable command in a program fed to the data processing system.

Many other variations, modifications and applications of the illustrated embodiment will be apparent.

What is claimed is:

1. A clock pulse gating system having two modes of operation, comprising:
    A. a clock pulse input terminal for inputting a train of clock pulses;
    B. a clock pulse output terminal;
    C. a single-shot clock circuit connected between said clock pulse input terminal and said clock pulse output terminal and including triggerable means selectively operable to allow the passage of only one clock pulse from said clock pulse input terminal to said clock pulse output terminal in one mode of operation of said gating system;
    D. a clock inhibit circuit connected between said clock pulse input and output terminals and including:
        i. a flip-flop network settable in a first condition enabling the passage of plural clock pulses from said clock pulse input terminal to said clock pulse output terminal in a second mode of operation of said gating system,
        ii. and STOP actuator means selectively operable to actuate said flip-flop network to a second condition inhibiting the passage of said plural clock pulses from said clock pulse input terminal to said clock pulse output terminal whereby said second mode of operation is terminated;
    E. and a clock enable circuit connected to said single-shot clock circuit and to said clock inhibit circuit, and including RUN actuator means selectively operable to trigger said single-shot clock circuit, said RUN actuator having further means cooperating with and responsive to said pulse from said triggered single-shot circuit to restore said flip-flop network to its first condition enabling the passage of said plural clock pulses from said clock pulse input terminal to said clock pulse output terminal in said second mode of operation.

2. A pulse gating system as defined in claim 1, wherein said triggerable means of the single-shot clock circuit comprises:
    i. a further flip-flop network settable in a first condition inhibiting the passage of clock pulses from the clock input terminal to the clock output terminal,
    ii. and SINGLE-SHOT actuator means selectively operable to actuate said further flip-flop network to a second condition allowing the passage of only one clock pulse from the clock input terminal to the clock output terminal.

3. A pulse gating system as defined in claim 2, wherein said further flip-flop network of the single-shot clock circuit comprises:
    i. a first flip-flop having a first input connected to receive a binary signal from the SINGLE-SHOT actuator means, a second input connected to receive the complement of said binary signal, a first output, and a second output complementary to the first output;
    ii a second flip-flop having a first input connected to the first output of the first flip-flop, a second input connected through a gate to the second output of the first flip-flop, a first output, and a second output complementary to the first output;
    iii. said gate having a first input connected to the second output of the first flip-flop, a second input connected to the first output of the second flip-flop, and a third input connected to receive the binary signal from the SINGLE-SHOT actuator means;
    iv. and means for applying the clock pulses inputted at the clock input terminal to said first and second flip-flops for clocking same.

4. A pulse gating system as defined in claim 3, further including a second gate, one input of the second gate being connected to the second output of the second flip-flop, a second input of the second gate being connected to receive the clock pulses inputted at the clock input terminal, the output of said second gate being connected to pass the clock pulse to the output terminal.

5. A pulse gating system as defined in claim 4, wherein said first and second flip-flop are both J-K flip-flops, said first and second inputs of each flip-flop being their J and K inputs, respectively; said first and second outputs of each flip-flop being their Q and $\bar{Q}$ output, respectively.

6. A pulse gating system as defined in claim 4, wherein said SINGLE-SHOT actuator means comprises a psuh-button switch.

7. A pulse gating system as defined in claim 6, wherein said SINGLE-SHOT actuator means further comprises a latching network including a pair of cross-connected gates between the push-button switch and the flip-flop network of the single-shot clock circuit.

8. A pulse gating system comprising:
A. a clock pulse input terminal for inputting a train of clock pulses;
B. a clock pulse output terminal;
C. a flip-flop network settable in a first condition inhibiting the passage of clock pulses from the clock input terminal to the clock output terminal; and
D. SINGLE-SHOT actuator means selectively operable to actuate said flip-flop network to a second condition to allow the passage of only one clock pulse from the clock input terminal to the clock output terminal; said flip-flop network comprising:
  i. a first flip-flop having a first input connected to receive a binary signal from the SINGLE-SHOT actuator means, a second input connected to receive the complement of said binary signal, a first output, and a second output complementary to the first output;
  ii. a second flip-flop having a first input connected to the first output of the first flip-flop, a second input connected through a gate to the second output of the first flip-flop, a first output, and a second output complementary to the first output;
  iii. said gate having a first input connected to the second output of the first flip-flop, a second input connected to the first output of the second flip-flop, and a third input connected to receive the binary signal from the SINGLE-SHOT actuator means;
  iv. and means for applying the clock pulses inputted at the clock input terminal to said first and second flip-flops for clocking same.

9. A pulse gating system as defined in claim 4, further including a third gate connected as its output to said flip-flop network of the pulse inhibit circuit, one input of said third gate being connected to the RUN actuator means of the pulse enable circuit, a second input of the third gate being connected to the output of said second gate such that when the latter gate is enabled, said third gate is also enabled to permit said RUN actuator means to restore the flip-flop network of the clock inhibit circuit to its said first condition.

10. A pulse gating system as defined in claim 3, wherein said flip-flop network of the clock inhibit circuit comprises a third flip-flop having a first input connected to said RUN actuator means, a second input connected to said STOP actuator means, a clocking terminal connected to said clock pulse input terminal, and an output connected to enable the passage of the clock pulses to said pulse output terminal.

11. A clock pulse gating system, comprising:
A. a clock pulse input terminal for inputting a train of clock pulses;
B. a clock pulse output terminal;
C. a clock inhibit circuit connected between the clock input and output terminals and including:
  i. a flip-flop network settable in a first condition enabling the passage of clock pulses from the clock input terminal to the clock output terminal;
  ii. and STOP actuator means effective when operated to actuate the flip-flop network to a second condition inhibiting the passage of clock pulses from the clock input terminal to the clock output terminal;
D. and a clock enable circuit including RUN actuator means effective when actuated to restore said flip-flop network to its first condition enabling the passage of clock pulses from the clock input terminal to the clock output terminal; said flip-flop network of comprising a flip-flop having:
  a. a first input connected to said RUN actuator means;
  b. a second input connected to said STOP actuator means;
  c. a clocking terminal connected to said clock pulse input terminal;
  d. and an output connected to enable the passage of the clock pulses to said clock pulse output terminal.

12. A pulse gating system as define in claim 11, wherein said last-mentioned flip-flop is a J-K flip-flop, said first input being its J-terminal and said second input being its K-terminal.

13. A pulse gating system as defined in claim 1, wherein said STOP actuator means includes a push-button switch effective when depressed to actuate said flip-flop network of the clock inhibit circuit to the said second condition inhibiting the passage of clock pulses from the clock input terminal to the clock output terminal.

14. A pulse gating system as defined in claim 13, wherein said STOP actuator means further includes a latching network having a pair of cross-connective gates connected between the STOP push-button switch and the flip-flop network of the clock inhibit circuit.

15. A pulse gating system as defined in claim 1, wherein said STOP actuator means includes an electrical condition sensing device effective when sensing the electrical condition to actuate said flip-flop network of the clock inhibit circuit to the second condition inhibiting the passage of clock pulses from the clock input terminal to the clock output terminal.

16. A pulse gating system as defined in claim 1, wherein said RUN actuator means includes a push-button switch effective when depressed to actuate said flip-flop network of the clock inhibit circuit.

17. A pulse gating system as defined in claim 16, further including a latching network comprising a pair of cross-connected gates connected between the RUN push-button switch and the flip-flop network of the clock inhibit circuit.

* * * * *